United States Patent
Palles-Dimmock et al.

(10) Patent No.: US 10,741,782 B2
(45) Date of Patent: Aug. 11, 2020

(54) LIGHT-EMITTING DEVICE WITH MIXED NANOPARTICLE CHARGE TRANSPORT LAYER

(71) Applicant: Sharp Kabushiki Kaisha, Osaka (JP)

(72) Inventors: James Andrew Robert Palles-Dimmock, Oxford (GB); Edward Andrew Boardman, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 167 days.

(21) Appl. No.: 15/928,154

(22) Filed: Mar. 22, 2018

(65) Prior Publication Data
US 2019/0296257 A1  Sep. 26, 2019

(51) Int. Cl.
*H01L 51/50* (2006.01)

(52) U.S. Cl.
CPC ........ *H01L 51/5072* (2013.01); *H01L 51/502* (2013.01); *H01L 51/5004* (2013.01); *H01L 51/5056* (2013.01); *H01L 2251/303* (2013.01); *H01L 2251/5369* (2013.01)

(58) Field of Classification Search
CPC ............ H01L 51/5072; H01L 51/5056; H01L 2251/303; H01L 51/5004; H01L 51/5016; H01L 2251/5369; H01L 2251/552
See application file for complete search history.

(56) References Cited

U.S. PATENT DOCUMENTS 6,838,816 B2   1/2005  Su et al.
7,615,800 B2  11/2009  Kahen
8,299,700 B2  10/2012  Iwamatsu et al.
8,361,823 B2   1/2013  Kahen
9,525,148 B2  12/2016  Kazlas et al.
2008/0156371 A1*  7/2008  Locascio ................ B82Y 20/00
                                                        136/258

(Continued)

FOREIGN PATENT DOCUMENTS

CN  106410051  2/2017
CN  106575661  4/2017
KR  101626525  6/2016

*Primary Examiner* — Khiem D Nguyen
(74) *Attorney, Agent, or Firm* — Renner, Otto, Boisselle & Sklar, LLP

(57) ABSTRACT

A light-emitting device is optimized for radiative recombination and minimizes non-radiative recombination. The light-emitting device includes an emissive layer, a first electrode and a second electrode from which charges are generated, a first charge transport layer that injects charges from the first electrode into the emissive layer, and a second charge transport layer that injects charges from the second electrode into the emissive layer. At least one of the charge transport layers includes a mixture of a first nanoparticle population and a second nanoparticle population, and the first nanoparticle population and the second nanoparticle population are conductive nanoparticles that are energetically non-aligned as between the first nanoparticle population and the second nanoparticle population. Nanoparticles of the first nanoparticle population and the second nanoparticle population are energetically non-aligned with each other by being made of different materials, by having nanoparticles of different sizes, and/or by having nanoparticles of different shapes.

13 Claims, 10 Drawing Sheets

(56) References Cited

U.S. PATENT DOCUMENTS

| | | | |
|---|---|---|---|
| 2009/0286338 A1* | 11/2009 | Coe-Sullivan | B81C 1/0038 |
| | | | 438/29 |
| 2010/0139770 A1* | 6/2010 | Scher | B82Y 10/00 |
| | | | 136/261 |
| 2011/0284819 A1* | 11/2011 | Kang | B82Y 20/00 |
| | | | 257/9 |
| 2013/0240851 A1* | 9/2013 | Seo | H01L 51/5016 |
| | | | 257/40 |
| 2014/0054540 A1* | 2/2014 | Zhou | H01L 31/035209 |
| | | | 257/9 |
| 2018/0138434 A1* | 5/2018 | Yoon | H01L 51/502 |

* cited by examiner

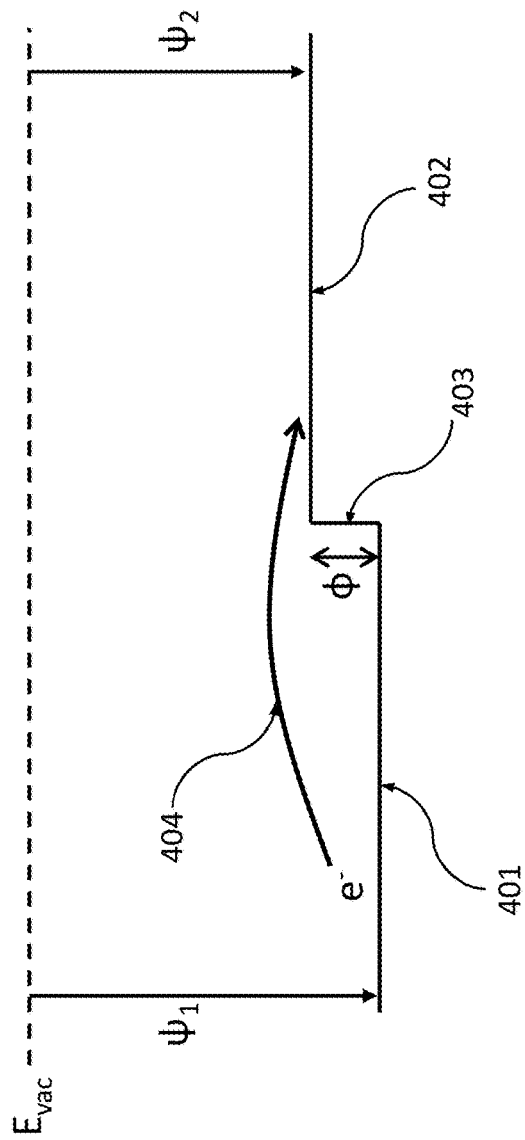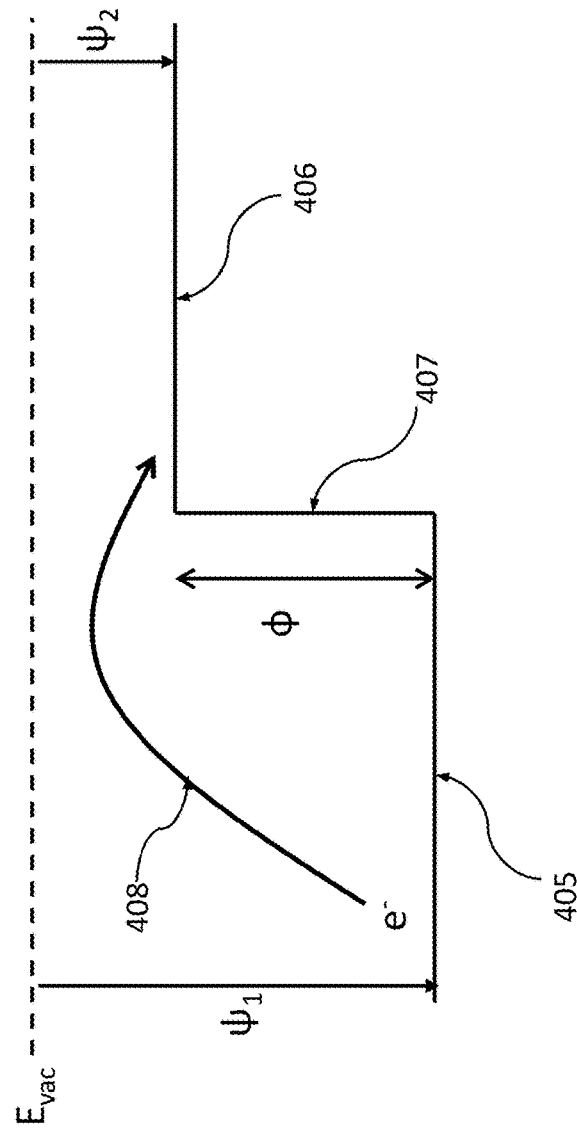
Fig. 4

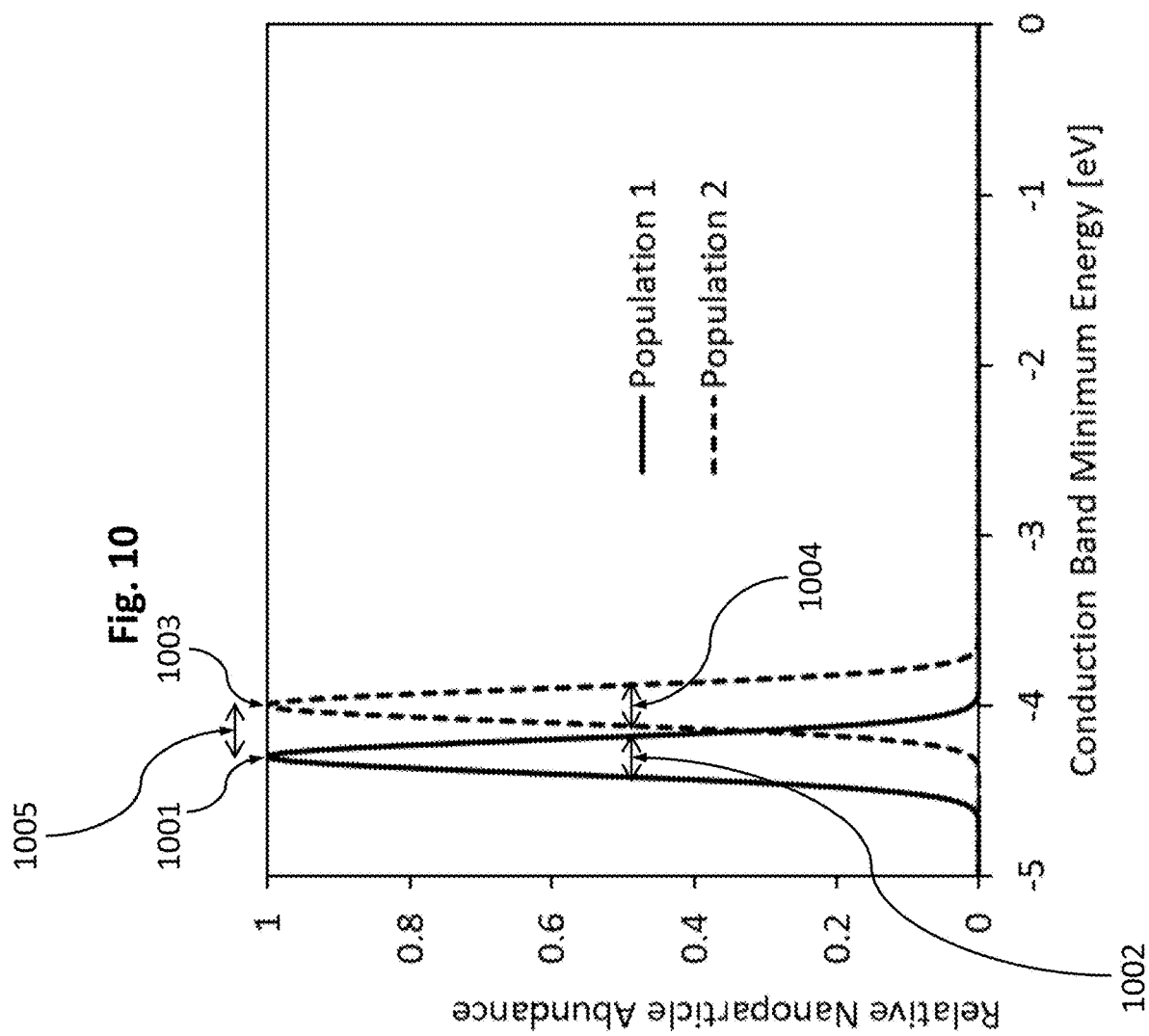

LIGHT-EMITTING DEVICE WITH MIXED NANOPARTICLE CHARGE TRANSPORT LAYER

TECHNICAL FIELD

The present invention relates to light-emitting devices including inorganic nanoparticle layers for charge transport, and more particularly to devices in which an inorganic nanoparticle layer acts as a charge transport layer in a light-emitting device.

BACKGROUND ART

An example of a conventional light-emitting device is described in U.S. Pat. No. 9,525,148 (Kazlas et al., issued Dec. 20, 2016). FIG. 1 is a drawing depicting an exemplary representation of such a conventional light-emitting device. A conventional light-emitting device includes an anode 104 and cathode 100, and a light-emitting layer 102 containing a material that emits light 107. Within the light-emitting layer 102, light is produced upon electron and hole recombination to generate the light 107. The light-emitting layer 102 may be an inorganic or organic semiconductor layer, or a layer of quantum dots (QDs). At least one hole transport layer 103 is located between the anode 104 and the emissive layer 102, which provides transport of holes from the anode and injection of holes into the emissive layer. Similarly, at least one electron transport layer 101 is located between the cathode 100 and emissive layer 102, which provides transport of electrons from the cathode and injection of electrons into the emissive layer.

FIG. 2 is a drawing depicting the conventional band structure of a conventional light-emitting device as depicted in FIG. 1. FIG. 2 depicts how each layer is important in the transport and recombination of charges and holes in the light-emitting device. In such conventional structures, the layer (or layers) between the cathode and emissive layer (EML) is termed the electron transport layer (ETL), and the layer (or layers) between the anode and the EML is termed the hole transport layer (HTL). The ETL and HTL are collectively referred to more generally as charge transport layers (CTL). The purpose of these CTLs is to provide an ohmic contact to the respective electrode (anode or cathode), and to provide energetic alignment for injecting carriers into the emissive layer.

It is desirable for the HTL to have a highest occupied molecular orbital (HOMO, also referred to as a valence band maximum) that is energetically close to the HOMO (valence band maximum) of the EML to provide efficient hole injection 202. Furthermore, it is desirable for the ETL to have a lowest unoccupied molecular orbital (LUMO, or conduction band minimum) that is energetically close to the LUMO (conduction band minimum) of the EML to provide efficient electron injection 201. Providing efficient and balanced injection of electrons 201 and holes 202 into the EML allows efficient recombination 203 of electrons and holes in the EML, and in turn efficient generation of light 204 from the EML. In this context, balanced injection refers to equal electron and hole current densities being injected into the EML from the ETL and HTL respectively.

An electron injection layer (EIL) or a hole injection layer (HIL) can also be present within the ETL or HTL layers, and is primarily used to aid carrier transfer from the electrode into the adjacent ETL or HTL. An HIL is explicitly present in FIG. 2, as it is common in conventional QD LED structures, but an HIL or EIL may be present within any standard HTL or ETL multi-layers. Specifically, as used herein, an EIL/HIL is a particular kind of ETL/HTL with the specific intention of bridging the energetic gap between the electrode and another ETL/HTL, and thus can be considered an ETL/HTL itself.

Referring back to FIG. 1, in conventional structures the ETL is often comprised of a matrix of nanoparticles 106, which provides electron transport through hopping 105 between adjacent nanoparticles 106 and into the emitting layer 102. Fabricating the device in this way provides a robust ETL, which reduces oxygen and moisture ingress into the EML. Such a configuration, however, has a deficiency in that the ETL has a fixed mobility for a given nanoparticle material configuration. Ideally, to promote radiative (light-emitting) recombination and reduce non-radiative (non-light-emitting) recombination, which occurs more readily when there is an imbalance of electrons and holes in the EML, the mobility of electrons in the ETL should be set at a particular value relative to the mobility of holes in the HTL (or vice versa). For example, it may be preferable for the mobility of electrons in the ETL to be equal to the mobility of holes in the HTL, or an integer multiple thereof, or otherwise matched to maximize radiative recombination.

Conventional processes relating to layers including nanoparticles in quantum dot (QD) light-emitting diodes (QDLED) generally provide conductive paths through an emissive layer, e.g. a mixture of emissive QDs and conductive nanoparticles for improving charge injection into the QDs. See, for example, U.S. Pat. No. 8,361,823 (Kahen, issued Jan. 29, 2013) and U.S. Pat. No. 7,615,800 (Kahen, issued Nov. 10, 2009). Nanoparticle compositions also have been used to provide better sealing of the light-emitting region through the addition of chemically inert nanoparticles. See U.S. Pat. No. 6,838,816 (Su et al, issued Jan. 4, 2005). Conventional processes relating to the nanoparticle charge transfer layers of a QDLED have most commonly tried to tune the mobility by varying the material composition of the ETL layer including homogeneous nanoparticles. See, e.g., KR 101626525B1 (Yang et al., issued Jun. 1, 2016) and CN 106410051 (Zheng et al., published Feb. 15, 2017). Even using such teachings, however, optimization of charge mobility to match ETL electron injection and HTL hole injection has not been achieved.

SUMMARY OF INVENTION

This present invention relates generally to charge transfer layers that can be fabricated with a target charge mobility by being comprised of a mixture of two distinct, energetically non-aligned nanoparticle populations. Conventional nanoparticle compositions have not included mixtures of two different, conductive, and non-emissive nanoparticles to tune the mobility of a charge transport layer.

To provide a robust charge transfer layer with a specific charge mobility, embodiments of the present invention include a light-emitting device structure with a novel charge transfer layer comprised of a mixture of at least two different populations of nanoparticles, in which the two different populations of nanoparticles differ in the energetic alignment of either or both of their conduction band or valence band edge. Such a combination of nanoparticles provides an effective resistance that is not a simple average of their individual resistances, but provides a much larger range of tunability, due to the method of conduction that occurs in a nanoparticle matrix. The different populations of nanoparticles may be energetically non-aligned by being made of different materials, or by being particles of different sizes or shapes of a same or similar material.

The meaning of energetically non-aligned for two nanoparticle populations is illustrated with particular reference to FIG. 10, in which it is clear that, while there might be a spread of conduction band minimum or valence band maximum energies of nanoparticles within each population, there is a most probable value within each distribution, and this gives rise to a difference in the (modal) average between two such populations. FIG. 10 shows a first nanoparticle population with a first average conduction band minimum energy 1001 and a first energetic width for the population 1002 and a second nanoparticle population with a second average conduction band minimum energy 1003 and a second energetic width for the population 1004, in which the separation 1005 between the first average conduction band minimum energy 1001 and the second average conduction band minimum energy 1003 is at least 0.2 eV.

An aspect of the invention is a light-emitting device that is optimized for radiative recombination and minimizes non-radiative recombination. In exemplary embodiments, the light-emitting device includes an emissive layer, a first electrode and a second electrode from which charges are generated, a first charge transport layer that injects charges from the first electrode into the emissive layer, and a second charge transport layer that injects charges from the second electrode into the emissive layer. At least one of the charge transport layers includes a mixture of a first nanoparticle population and a second nanoparticle population, and the first nanoparticle population and the second nanoparticle population are conductive nanoparticles that are energetically non-aligned as between the first nanoparticle population and the second nanoparticle population.

Nanoparticles of the first nanoparticle population and the second nanoparticle population are energetically non-aligned with each other by being made of different materials, by having nanoparticles of different sizes, and/or by having nanoparticles of different shapes. Nanoparticles of the first nanoparticle population and the second nanoparticle population also are non-emissive within a wavelength range of light emission from the emissive layer. In exemplary embodiments, the first electrode is a cathode and the second electrode is an anode, the first charge transport layer is an electron transport layer that injects electrons from the cathode into the emissive layer, and the second charge transport layer is a hole transport layer that injects holes from the anode into the emissive layer. The electron transport layer, the hole transport layer, or both the electron transport layer and the hole transport layer include a mixture of a first nanoparticle population and a second nanoparticle population, which can be mixtures of different nanoparticle populations for the ETL and the HTL so as to support hole transport or electron transport as required.

Another aspect of the invention is a method of manufacturing a light-emitting device in a manner that optimizes radiative recombination and minimizes non-radiative recombination. In exemplary embodiments, the method includes the steps of forming a light emitting device according to any of the embodiments, and incorporating into at least one of the charge transport layers a mixture of a first nanoparticle population and a second nanoparticle population, and the first nanoparticle population and the second nanoparticle population are conductive nanoparticles that are energetically non-aligned with each other. A proportion of the first nanoparticle population relative to the second nanoparticle population is selected such that a mobility of charges in the first charge transport layer is tuned to a mobility of charges in the second charge transport layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 4 is a drawing depicting exemplary energy barriers for intersite transport between adjacent nanoparticles.

FIG. 10 is a graphical drawing depicting the energy distribution of two populations of nanoparticles with conduction band maxima separated by 0.3 eV.

DESCRIPTION OF EMBODIMENTS

Figure 1:
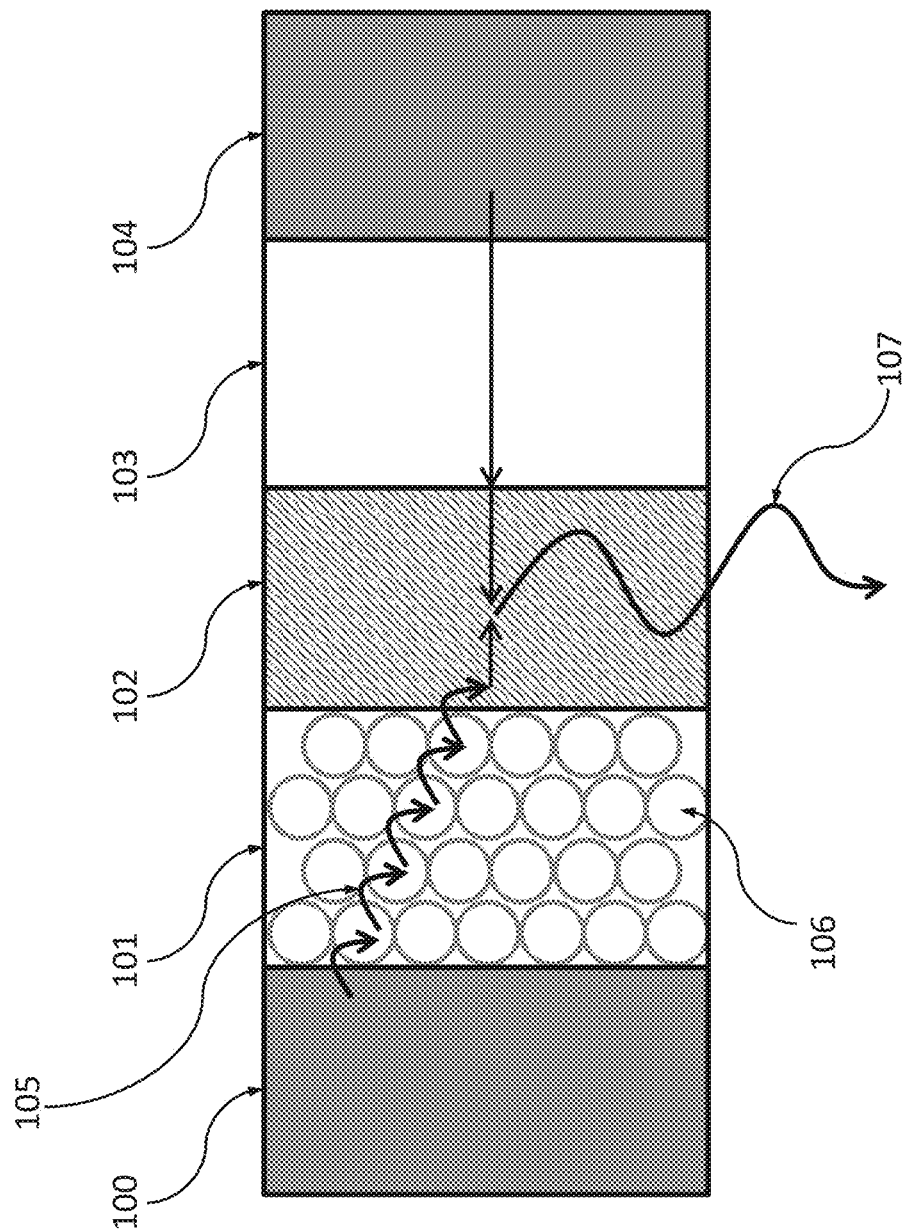
FIG. 1 is a drawing depicting an exemplary representation of a conventional light-emitting device.
Figure 2:
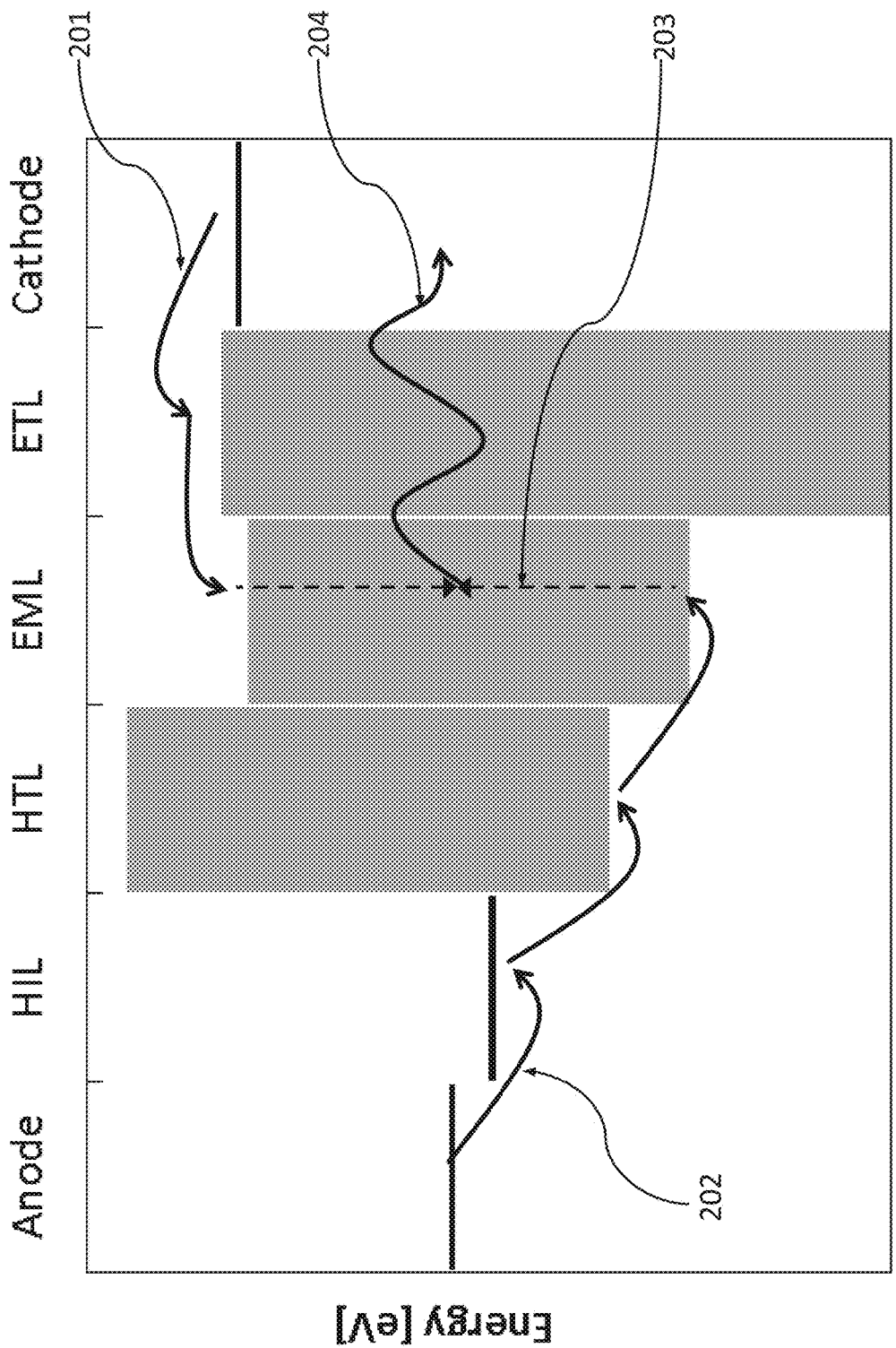
FIG. 2 is a drawing depicting the conventional band structure of a conventional light-emitting device comparably as depicted in FIG. 1.

Embodiments of the present invention will now be described with reference to the drawings, wherein like reference numerals are used to refer to like elements throughout. It will be understood that the figures are not necessarily to scale.

To provide a robust charge transfer layer with a specific charge mobility, embodiments of the present invention include a light-emitting device structure with a novel charge transfer layer comprised of a mixture of at least two different populations of nanoparticles, in which the two different populations of nanoparticles differ in the energetic alignment of either or both of their conduction band or valence band edge. Such a combination of nanoparticles provides an effective resistance that is not a simple average of their individual resistances, but provides a much larger range of tunability, due to the method of conduction that occurs in a nanoparticle matrix. The different populations of nanoparticles may be energetically non-aligned by being made of different materials, or by being particles of different sizes or shapes of a same or similar material. Nanoparticles of the nanoparticle populations also are non-emissive within a wavelength range of light emission from the emissive layer.

Figure 3:
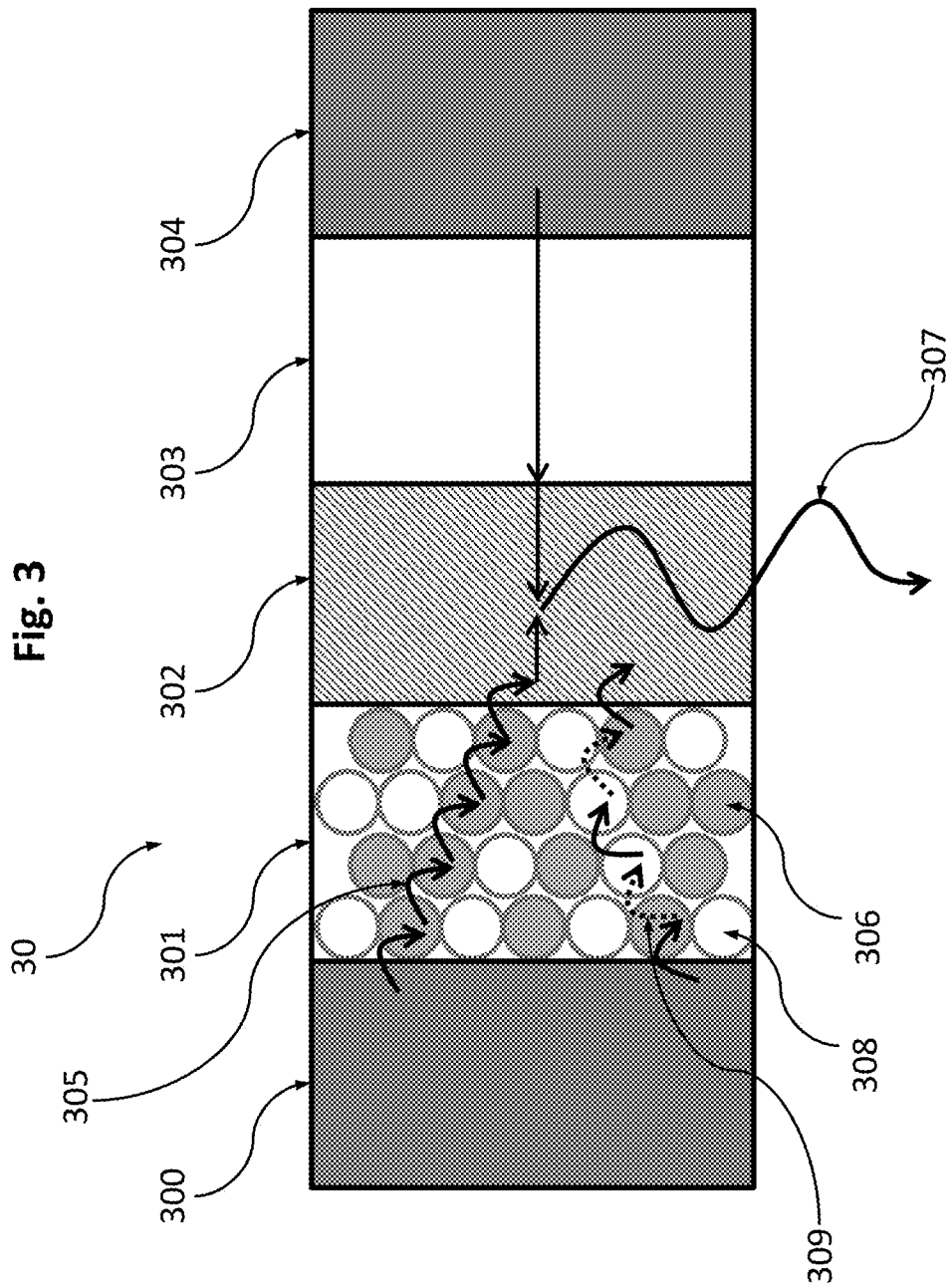
FIG. 3 is a drawing depicting an exemplary light-emitting device in accordance with embodiments of the present invention, having different populations of nanoparticles of different materials.

FIG. 3 is a drawing depicting an exemplary light-emitting device 30 in accordance with embodiments of the present invention, having different populations of nanoparticles of different materials. In overall or general structure, the light-emitting device 30 has features similarly as conventional configurations. The light-emitting device 30 includes an anode 304 and a cathode 300, and a light-emitting layer 302, which also may be referred to as an emissive layer (EML), containing a material that emits light 307. Within the light-emitting layer 302, light is produced upon electron and hole recombination to generate the light 307. The light-emitting layer 302 may be an inorganic or organic semiconductor layer, or a layer of quantum dots (QDs). At least one hole transport layer (HTL) 303 is provided between the anode 304 and the emissive layer 302, which provides transport of holes from the anode and injection of holes into the emissive layer. Similarly, at least one electron transport layer (ETL) 301 is provided between the cathode 300 and emissive layer 302, which provides transport of electrons from the cathode and injection of electrons into the emissive layer.

Generally, in a nanoparticle matrix, in particular one which is formed of metal oxide nanoparticles with wide band gaps, charge transport occurs by hopping of electrons or holes from one nanoparticle site to another adjacent nanoparticle site, with the rate of this intersite transport being related to the energy barrier (ϕ) presented, as detailed in equation 1.

$$\Gamma_{net(1\to 2)}(E, T) \propto e^{-\frac{(\phi-E)^2}{12k_B^2 T^2}} \left[ f_1(1-f_2)e^{-\frac{(\phi-E)}{2k_B T}} - f_2(1-f_1) \right] \quad 1$$

in which:
$\Gamma_{net(1\to 2)}(E,T)$ is the rate of intersite hopping from site 1 to site 2 for an electron with energy E relative to the conduction band minimum at a temperature T;
ϕ is the energy barrier in going to site 2 presented to a charge at site 1;
$f_{1,2}$ is the fermi function for electrons at site 1 or 2, and is a function of electron energy, the fermi energy for the site ($E_f$) and temperature (T); and
$k_B$ is the Boltzmann constant ($1.38\times10^{-23}$ m²·kg·s⁻²·K⁻¹).
Through this hopping mechanism, materials which are ordinarily not conductive, such as $Al_2O_3$, can be conductive when present as an array of nanoparticles.

FIG. 4 is a drawing depicting exemplary energy barriers for intersite transport between adjacent nanoparticles. For a homogeneous array of nanoparticles, hopping is possible to all adjacent sites, because the energy barrier is relatively small enough to be overcome by a relatively small thermal activation (or the application of a relatively small voltage). Referring to the top portion of FIG. 4, for a homogeneous array of nanoparticles that are energetically aligned, reference numeral 401 represents the energy level $\psi_1$ at a first site corresponding to a first nanoparticle, and reference numeral 402 represents the energy level $\psi_2$ at a second and adjacent site corresponding to a second nanoparticle. ϕ is the energy barrier 403 for an electron "e" to perform intersite transport 404 from the first site to the second site. The top portion of FIG. 4 illustrates a conduction band alignment between two homogenous nanoparticles that are essentially energetically aligned, by which a small energy barrier 403 is presented to the hopping electron 404.

In contrast, for a non-homogeneous array of nanoparticles in which adjacent nanoparticles may not be energetically aligned, the energy barrier increases to present an impediment to intersite transport between adjacent nanoparticles, which requires a relatively larger thermal activation (or the application of a relatively larger voltage) as compared to the homogeneous nanoparticles (or nanoparticles that otherwise are energetically aligned). Referring to the bottom portion of FIG. 4, for a non-homogeneous array of nanoparticles that are energetically non-aligned, reference numeral 405 represents the energy level $\psi_1$ at a first site corresponding to a first nanoparticle, and reference numeral 406 represents the energy level $\psi_2$ at a second and adjacent site corresponding to a second nanoparticle. ϕ is the energy barrier 407 for an electron "e" to perform intersite transport 408 from the first site to the second site. The bottom portion of FIG. 4 illustrates a conduction band alignment between two non-homogenous nanoparticles that are energetically non-aligned, by which a substantially larger energy barrier 407 is presented to the hopping electron 408.

Once the energy barrier between two adjacent nanoparticles is greater than approximately eight times the thermal energy, which at room temperature equates to an energy difference of approximately 0.2 eV, the transfer rate of intersite transport drops to less than 2% of the transfer rate between energetically identical nanoparticles, significantly hindering charge transport between adjacent, energetically non-aligned nanoparticles. The energy barrier between two adjacent nanoparticles is generally less than 4 eV. This difference in transfer rate between energetically aligned versus energetically non-aligned nanoparticles may be employed to configure one or more charge transport layers to a selected charge mobility of a target value to maximize radiative recombination.

An aspect of the invention, therefore, is a light-emitting device including an emissive layer, a first electrode and a second electrode from which charges are generated, a first charge transport layer that injects charges from the first electrode into the emissive layer, and a second charge transport layer that injects charges from the second electrode into the emissive layer. At least one of the charge transport layers includes a mixture of a first nanoparticle population and a second nanoparticle population, and the first nanoparticle population and the second nanoparticle population are conductive nanoparticles that are energetically non-aligned as between the first nanoparticle population and the second nanoparticle population.

Generally, the meaning of energetically non-aligned for two nanoparticle populations is illustrated with particular reference to FIG. 10, in which it is clear that, while there might be a spread of conduction band minimum or valence band maximum energies of nanoparticles within each population, there is a most probable value within each distribution, and this gives rise to a difference in the (modal) average between two such populations. FIG. 10 shows a first nanoparticle population with a first average conduction band minimum energy 1001 and a first energetic width for the population 1002 and a second nanoparticle population with a second average conduction band minimum energy 1003 and a second energetic width for the population 1004, in which the separation 1005 between the first average conduction band minimum energy 1001 and the second average conduction band minimum energy 1003 is at least 0.2 eV.

Referring to FIG. 3, the light-emitting device 30 has an ETL 301 including a first nanoparticle population 306 and a second nanoparticle population 308 (as represented by different shading), wherein the first nanoparticle population 306 and the second nanoparticle population 308 are conductive nanoparticles that are energetically non-aligned with each other by being made of different materials. Nanoparticles of the first nanoparticle population and the second nanoparticle population also are non-emissive within a wavelength range of light emission from the emissive layer. The nanoparticles may be energetically non-aligned with respect to either or both of their conduction band or valence band edge. Because of such mixture of energetically non-aligned nanoparticles, there consequently are different categories of intersite transport between two adjacent nanoparticles. In a first category of intersite transport 305 (as represented by the solid arrows in FIG. 3), intersite transport occurs between two energetically aligned nanoparticles, i.e., between particles of the same material. The intersite transport 305 thus corresponds to the top portion of FIG. 4, by which the barrier energy is relatively low. In a second category of intersite transport 309 (as represented by the dotted arrows in FIG. 3), intersite transport occurs between two energetically non-aligned nanoparticles, i.e., between particles of different materials. The intersite transport 309 thus corresponds to the bottom portion of FIG. 4, by which the barrier energy is relatively high.

This frustration of charge transport between energetically non-aligned nanoparticles by the high barrier energy, such as between the first nanoparticles 306 and second nanoparticles 308 of FIG. 3, has a consequence that a small addition of one population of nanoparticles to another results in a large change in the overall resistance of the mixture to charge transport. In the example of FIG. 3, the ETL 101 includes a mixture of two populations of nanoparticles of different materials, in which the primary method of conduction is percolation. Electrons hop to energetically aligned nanoparticles of the same material, as shown by transport 305, at a much higher rate than hopping to energetically non-aligned nanoparticles of different materials, as shown by transport 309.

Figure 5:
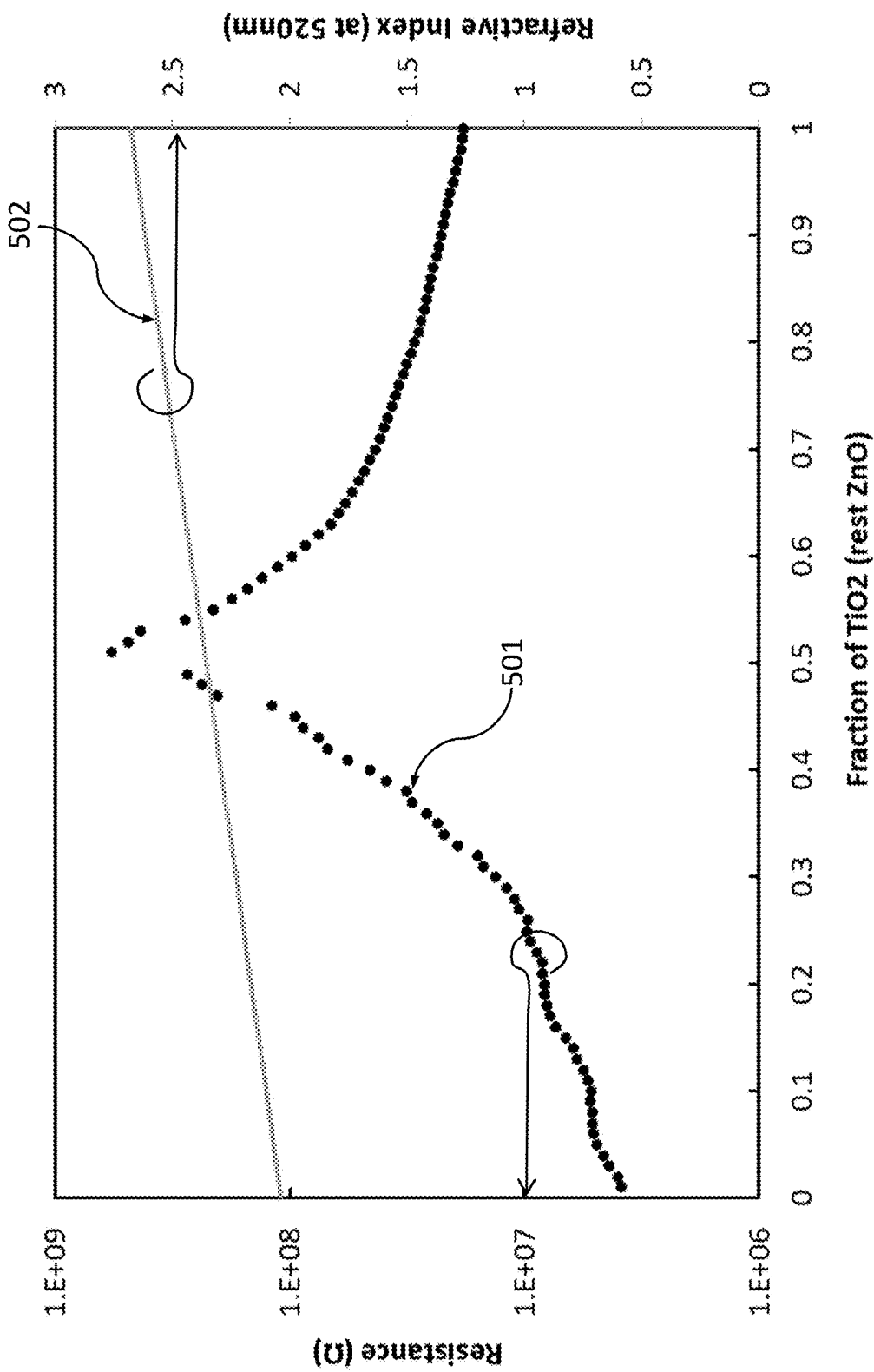
FIG. 5 is a graphical drawing depicting a modelling of carrier transport resistance for a mixture of nanoparticles that are energetically non-aligned.

FIG. 5 is a graphical drawing depicting a modelling of carrier transport resistance for a mixture of nanoparticles that are energetically non-aligned. In this example, a nanoparticle mixture includes a first population of nanoparticles made of titanium oxide ($TiO_2$) and a second population of nanoparticles made of zinc oxide (ZnO). The charge transport resistance is plotted against the proportion of $TiO_2$ nanoparticles relative to ZnO nanoparticles (plot 501). Modelling the resistance of such a mixed ETL layer, as shown in FIG. 5, reveals a range of tunability for the resistance of the ETL layer of over two orders of magnitude as the proportion of $TiO_2$ in the mixture is varied from 0 (all ZnO) to 1 (all $TiO_2$). The resistance is inversely related to the charge mobility. In particular, two nanoparticle populations, which are individually conductive when a homogeneous layer is formed, can become less conductive because of reduced charge hopping between different, energetically non-aligned nanoparticles. This is observed in FIG. 5, in which the resistance of a 100% ZnO or 100% $TiO_2$ ETL is approximately two orders of magnitude lower than the resistance of an even mixture of the two types of nanoparticles. The inventors have found that this relationship is not specific to these materials, and comparable relationships are observed in other suitable nanoparticle arrays in which the primary conduction mechanism is through electron hopping, for example in any mixture of two different metal oxide nanoparticle populations.

As seen in FIG. 5, therefore, the range of resistance is non-linear and permits a broad range of selectable resistance levels (and therefore by inverse selectable charge mobility) depending upon the selected relative proportion of the different nanoparticle populations. In this manner, a charge mobility target value can be selected by configuring nanoparticle populations in the ETL. As referenced above, to promote radiative (light-emitting) recombination and reduce non-radiative (non-light-emitting) recombination, which occurs more readily when there is an imbalance of electrons and holes in the EML, the mobility of electrons in the ETL should be set at a particular value relative to the mobility of holes in the HTL (or vice versa). For example, it may be preferable for the mobility of electrons in the ETL to be equal to the mobility of holes in the HTL, or an integer multiple thereof, or otherwise matched to maximize radiative recombination. By adjusting the relative proportion of different nanoparticles in the ETL, the mobility of electrons in the ETL may be configured as matched to the mobility of holes of the HTL to maximize radiative recombination.

Another aspect of the invention, therefore, is a method of manufacturing a light-emitting device in a manner that optimizes radiative recombination and minimizes non-radiative recombination. In exemplary embodiments, the method includes the steps of forming a light emitting device according to any of the embodiments, and incorporating into at least one of the charge transport layers a mixture of a first nanoparticle population and a second nanoparticle population, and the first nanoparticle population and the second nanoparticle population are conductive nanoparticles that are energetically non-aligned with each other. A proportion of the first nanoparticle population relative to the second nanoparticle population is selected such that a mobility of charges in the first charge transport layer is tuned to a mobility of charges in the second charge transport layer.

In contrast, other significant properties of the nanoparticle mixture are not significantly affected by the relative proportion of the different nanoparticle populations. For example, FIG. 5 also shows a plot 502 of refractive index as a function of the proportion of $TiO_2$ nanoparticles relative to ZnO nanoparticles. Comparing the refractive index plot 502 to the resistance plot 501, refractive index varies linearly and over a far narrower range as compared to resistance. The variation in charge mobility shown in plot 501, therefore, is markedly different from the variation one might expect for a mixture of two nanoparticle materials, where commonly the properties of the mixture follows a dependence similar to linear interpolation between the properties of the two materials as the fractions of the two materials are adjusted, as shown in plot 502 for refractive index. The variation in charged mobility, therefore, provides an unexpected and enhanced result, by which an appropriate resistance can be tuned or set over a broad range by a specific selected proportion of the different nanoparticle populations, without having a significant effect on other properties of the light-emitting device.

The use of a nanoparticle mixture having nanoparticle populations of energetically non-aligned nanoparticles has unexpected and enhanced advantages over conventional configurations. A charge transport layer may be realized with a charge mobility (or resistance) that matches a target value to achieve balanced injection of electrons and holes into the EML, thereby achieving a high-efficiency QLED, using commonly available and/or low-cost nanoparticle materials.

Manufacturing is simple as the mixed nanoparticle layer(s) may be fabricated in a single process step. In contrast, with use of conventional homogeneous layers or layers that otherwise are energetically aligned, such a configuration would not be capable of providing the optimal target value of charge mobility In addition, the charge mobility of the charge transport layer(s) of the present invention is selectable independently of other properties of the charge transport layer. For example, as referenced above, the dependence of charge mobility on the proportion of a second nanoparticle population does not follow linear interpolation, but the refractive index of the layer does follow a linear interpolation and varies over a narrower range. Therefore, optimum charge mobility may be achieved while maintaining an essentially optimal refractive index. This is important for QD-LED structures in which the refractive index of a charge transport layer may be important for determining the efficiency of extraction of light due to the formation of an optical cavity including the charge transport layer.

In the embodiment of FIG. 3, different populations of energetically non-aligned nanoparticles are provided by the use of different materials. There are additional mechanisms for providing different populations of energetically non-aligned nanoparticles. In particular, nanoparticles of the first nanoparticle population and the second nanoparticle population may be made energetically non-aligned with each other by being made of different materials (as in the embodiment of FIG. 3), by having nanoparticles of different sizes, and/or by having nanoparticles of different shapes.

Figure 6:
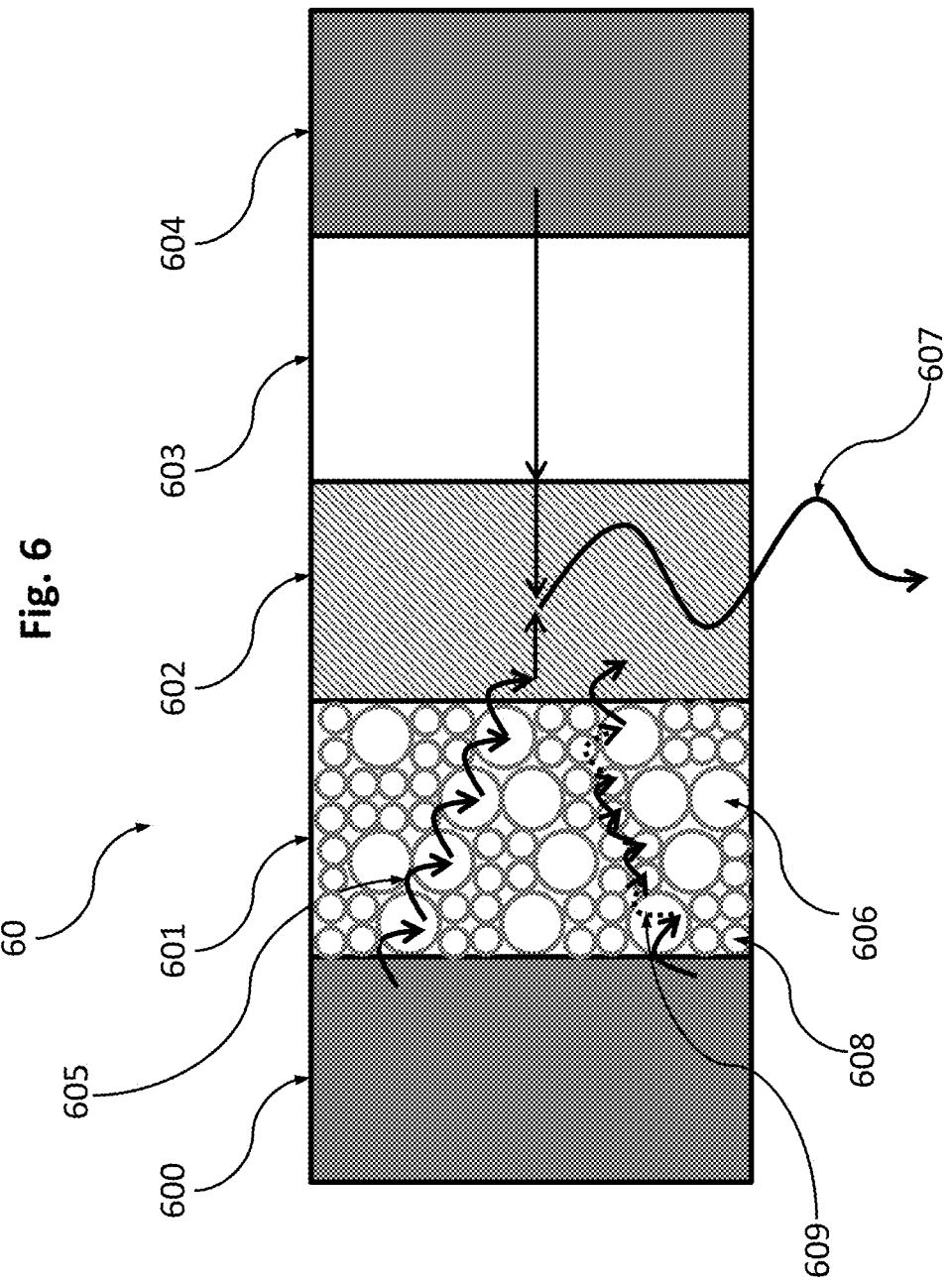
FIG. 6 is a drawing depicting an exemplary light-emitting device in accordance with embodiments of the present invention, having different populations of nanoparticles of different sizes.

FIG. 6 is a drawing depicting an exemplary light-emitting device 60 in accordance with embodiments of the present invention, having different populations of nanoparticles of different sizes. The light-emitting device 60 includes an anode 604 and a cathode 600, and a light-emitting layer 602 containing a material that emits light 607. Within the light-emitting layer 602, light is produced upon electron and hole recombination to generate the light 607. The light-emitting layer 602 may be an inorganic or organic semiconductor layer, or a layer of quantum dots (QDs). At least one hole transport layer (HTL) 603 is provided between the anode 604 and the emissive layer 603, which provides transport of holes from the anode and injection of holes into the emissive layer. Similarly, at least one electron transport layer (ETL) 601 is provided between the cathode 600 and emissive layer 602, which provides transport of electrons from the cathode and injection of electrons into the emissive layer.

In the embodiment of FIG. 6, the ETL 601 includes a first nanoparticle population 606 and a second nanoparticle population 608, wherein the first nanoparticle population 606 and second nanoparticle population 608 are conductive nanoparticles that are energetically non-aligned by being particles of different sizes of the same or energetically similar nanoparticle material. As shown in FIG. 6, for example, nanoparticles 606 are larger relative to nanoparticles 608. Nanoparticles of the first nanoparticle population and the second nanoparticle population also are non-emissive within a wavelength range of light emission from the emissive layer.

Because of such mixture of energetically non-aligned nanoparticles, again there consequently are different categories of intersite transport between two adjacent nanoparticles. In a first category of intersite transport 605 (as represented by the solid arrows in FIG. 6), intersite transport occurs between two energetically aligned nanoparticles, i.e., between particles of the same size. The intersite transport 605 thus corresponds to the top portion of FIG. 4, by which the barrier energy is relatively low. In a second category of intersite transport 609 (as represented by the dotted arrows in FIG. 6), intersite transport occurs between two energetically non-aligned nanoparticles, i.e., between particles of different sizes. The intersite transport 609 thus corresponds to the bottom portion of FIG. 4, by which the barrier energy is relatively high. Electrons hop to energetically aligned nanoparticles of the same size, as shown by transport 605, at a much higher rate than hopping to energetically non-aligned nanoparticles of different sizes, as shown by transport 609. Such configuration achieves an energy difference in the conduction band and/or valence band edge of at least 0.2 eV through quantum confinement, and generally between 0.2 eV and 4 eV at room temperature.

Figure 7:
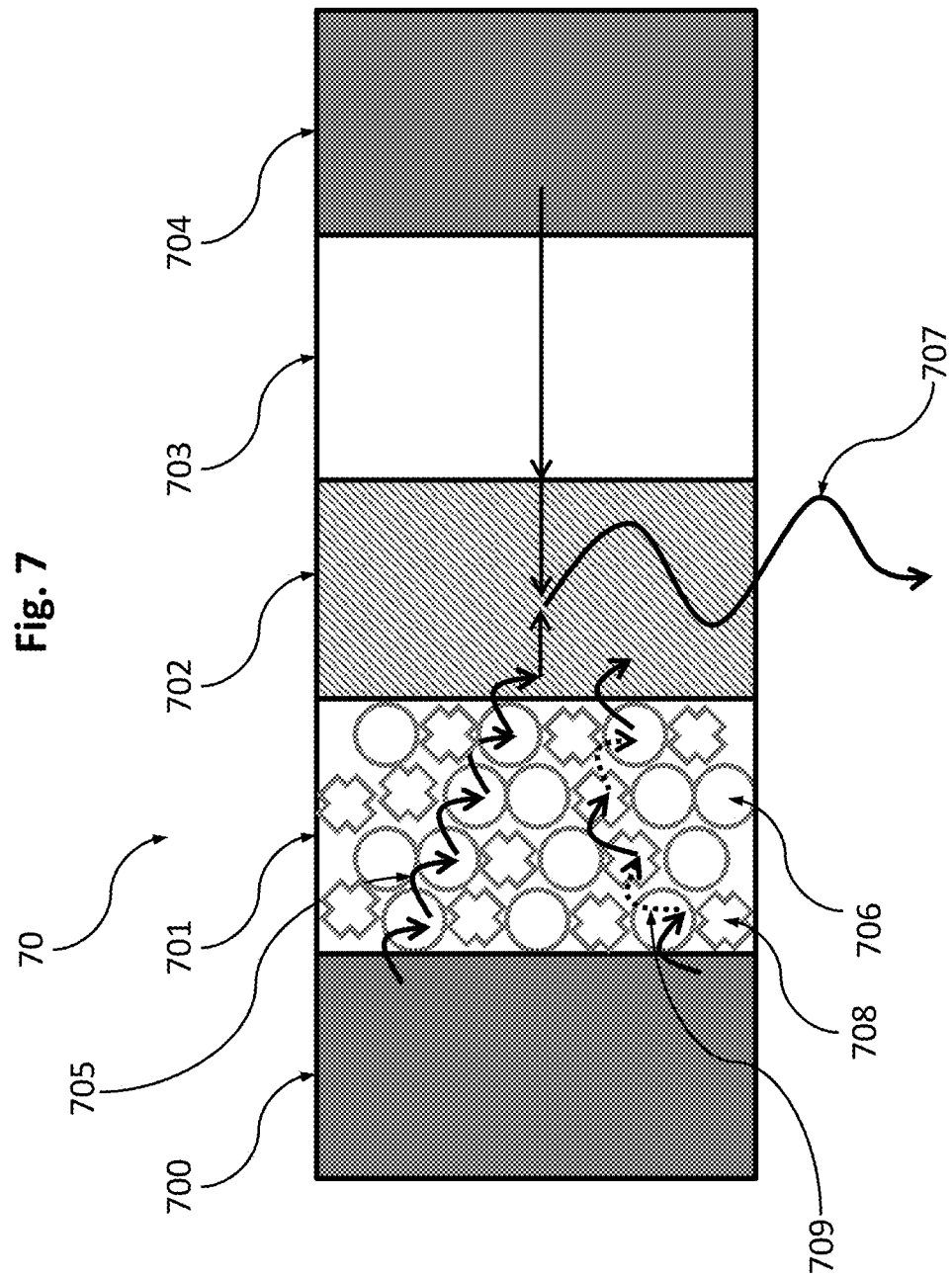
FIG. 7 is a drawing depicting an exemplary light-emitting device in accordance with embodiments of the present invention, having different populations of nanoparticles of different shapes.

FIG. 7 is a drawing depicting an exemplary light-emitting device 70 in accordance with embodiments of the present invention, having different populations of nanoparticles of different shapes. The light-emitting device 70 includes an anode 704 and a cathode 700, and a light-emitting layer 702 containing a material that emits light 707. Within the light-emitting layer 702, light is produced upon electron and hole recombination to generate the light 707. The light-emitting layer 702 may be an inorganic or organic semiconductor layer, or a layer of quantum dots (QDs). At least one hole transport layer (HTL) 703 is provided between the anode 704 and the emissive layer 703, which provides transport of holes from the anode and injection of holes into the emissive layer. Similarly, at least one electron transport layer (ETL) 701 is provided between the cathode 700 and emissive layer 702, which provides transport of electrons from the cathode and injection of electrons into the emissive layer.

In the embodiment of FIG. 7, the ETL 701 includes a first nanoparticle population 706 and a second nanoparticle population 708, wherein the first nanoparticle population 706 and second nanoparticle population 708 are conductive nanoparticles that are energetically non-aligned by being particles of different shapes of the same or energetically similar nanoparticle material. The shapes shown in FIG. 7 are illustrative examples, and any suitable shapes of different populations of nanoparticles may be employed. Nanoparticles of the first nanoparticle population and the second nanoparticle population also are non-emissive within a wavelength range of light emission from the emissive layer.

Because of such mixture of energetically non-aligned nanoparticles, again there consequently are different categories of intersite transport between two adjacent nanoparticles. In a first category of intersite transport 705 (as represented by the solid arrows in FIG. 7), intersite transport occurs between two energetically aligned nanoparticles, i.e., between particles of the same shape. The intersite transport 705 thus corresponds to the top portion of FIG. 4, by which the barrier energy is relatively low. In a second category of intersite transport 709 (as represented by the dotted arrows in FIG. 7), intersite transport occurs between two energetically non-aligned nanoparticles, i.e., between particles of different shapes. The intersite transport 709 thus corresponds to the bottom portion of FIG. 4, by which the barrier energy is relatively high. Electrons hop to energetically aligned nanoparticles of the same shape, as shown by transport 705, at a much higher rate than hopping to energetically non-aligned nanoparticles of different shapes, as shown by transport 709. Such configuration achieves an energy difference in the conduction band and/or valence band edge of at least 0.2 eV through quantum confinement, and generally between 0.2 eV and 4 eV at room temperature.

In the previous embodiments, the different populations of energetically non-aligned nanoparticles were provided in the ETL. More generally, however, the different populations of energetically non-aligned nanoparticles (e.g., using different materials, particle sizes, and/or particle shapes) may be provided in any charge transport layer (CTL), or combinations thereof. For example, the different populations of energetically non-aligned nanoparticles may be provided in one or more ETLs, in one or more HTLs, or in a combination of one or more ETLs and one or more HTLs. Accordingly, an electron transport layer, a hole transport layer, or both an electron transport layer and a hole transport layer may include the mixture of the first nanoparticle population and the second nanoparticle population.

Figure 8:
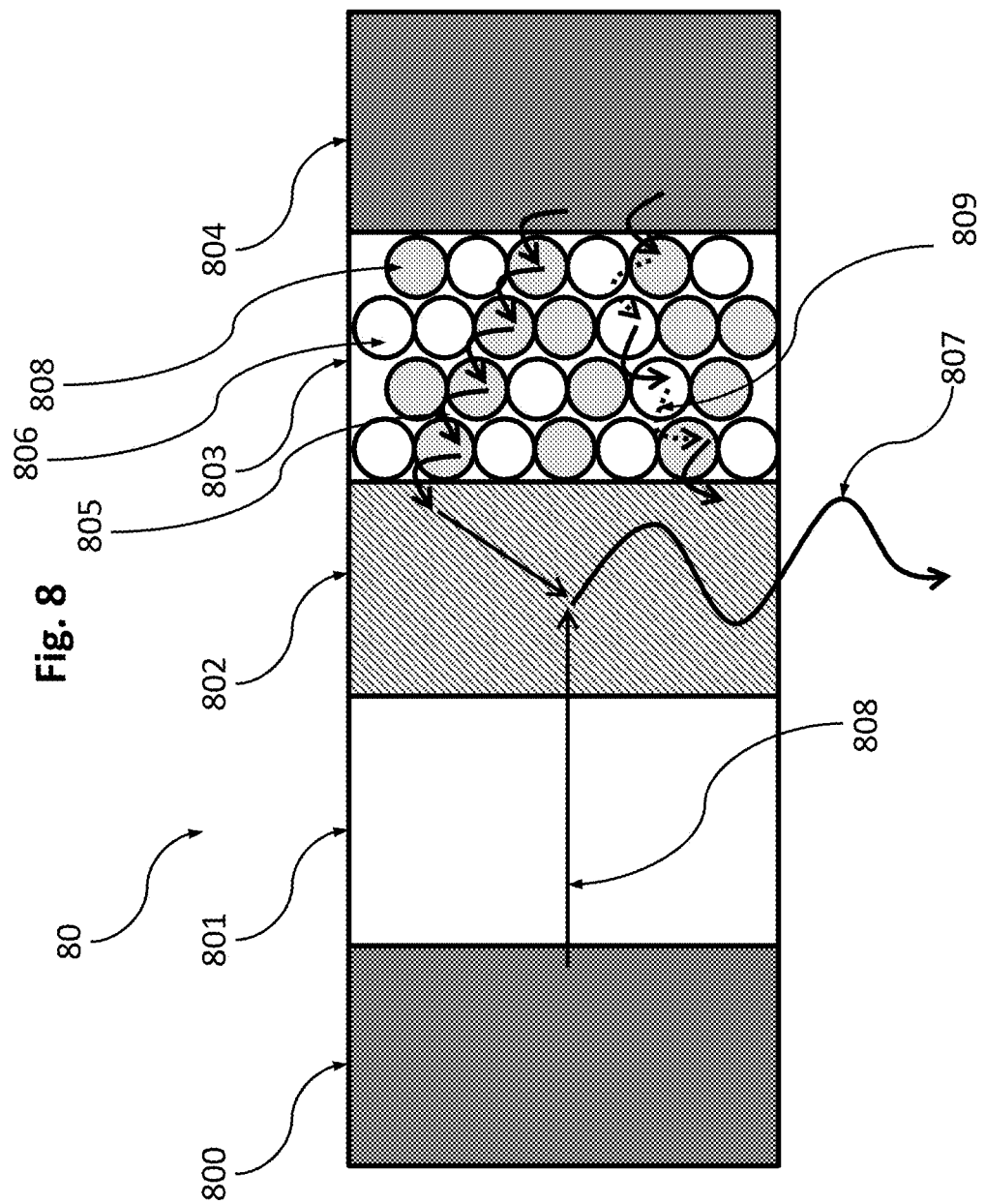
FIG. 8 is a drawing depicting an exemplary light-emitting device in accordance with embodiments of the present invention, having different populations of nanoparticles located within an HTL.

FIG. 8 is a drawing depicting an exemplary light-emitting device 80 in accordance with embodiments of the present invention, having different populations of nanoparticles located within an HTL. The light-emitting device 80 includes an anode 804 and a cathode 800, and a light-emitting layer 802 containing a material that emits light 807. Within the light-emitting layer 802, light is produced upon electron and hole recombination to generate the light 807. The light-emitting layer 802 may be an inorganic or organic semiconductor layer, or a layer of quantum dots (QDs). At least one hole transport layer (HTL) 803 is provided between the anode 804 and the emissive layer 802, which provides transport of holes from the anode and injection of holes into the emissive layer. Similarly, at least one electron transport layer (ETL) 801 is provided between the cathode 800 and emissive layer 802, which provides transport of electrons from the cathode and injection of electrons into the emissive layer.

In the embodiment of FIG. 8, the HTL 803 includes a first nanoparticle population 806 and a second nanoparticle population 808, wherein the first nanoparticle population 806 and second nanoparticle population 808 are conductive nanoparticles that are energetically non-aligned. Although the example of FIG. 8 looks comparable to FIG. 3 in using different shading (which in FIG. 3 denotes different materials), any suitable property may be employed for rendering the different nanoparticle populations energetically non-aligned, including different materials, different nanoparticle sizes, and/or different nanoparticle shapes.

Because of such mixture of energetically non-aligned nanoparticles, again there consequently are different categories of intersite transport between two adjacent nanoparticles. In a first category of intersite transport 805 (as represented by the solid arrows in FIG. 8), intersite transport occurs between two energetically aligned nanoparticles. The intersite transport 805 thus corresponds to the top portion of FIG. 4, by which the barrier energy is relatively low. In a second category of intersite transport 809 (as represented by the dotted arrows in FIG. 8), intersite transport occurs between two energetically non-aligned nanoparticles. The intersite transport 809 thus corresponds to the bottom portion of FIG. 4, by which the barrier energy is relatively high. Holes hop to energetically aligned nanoparticles, as shown by transport 805, at a much higher rate than hopping to energetically non-aligned nanoparticles, as shown by transport 809. Such configuration achieves an energy difference in the conduction band and/or valence band edge of at least 0.2 eV through quantum confinement, and generally between 0.2 eV and 4 eV at room temperature.

Figure 9:
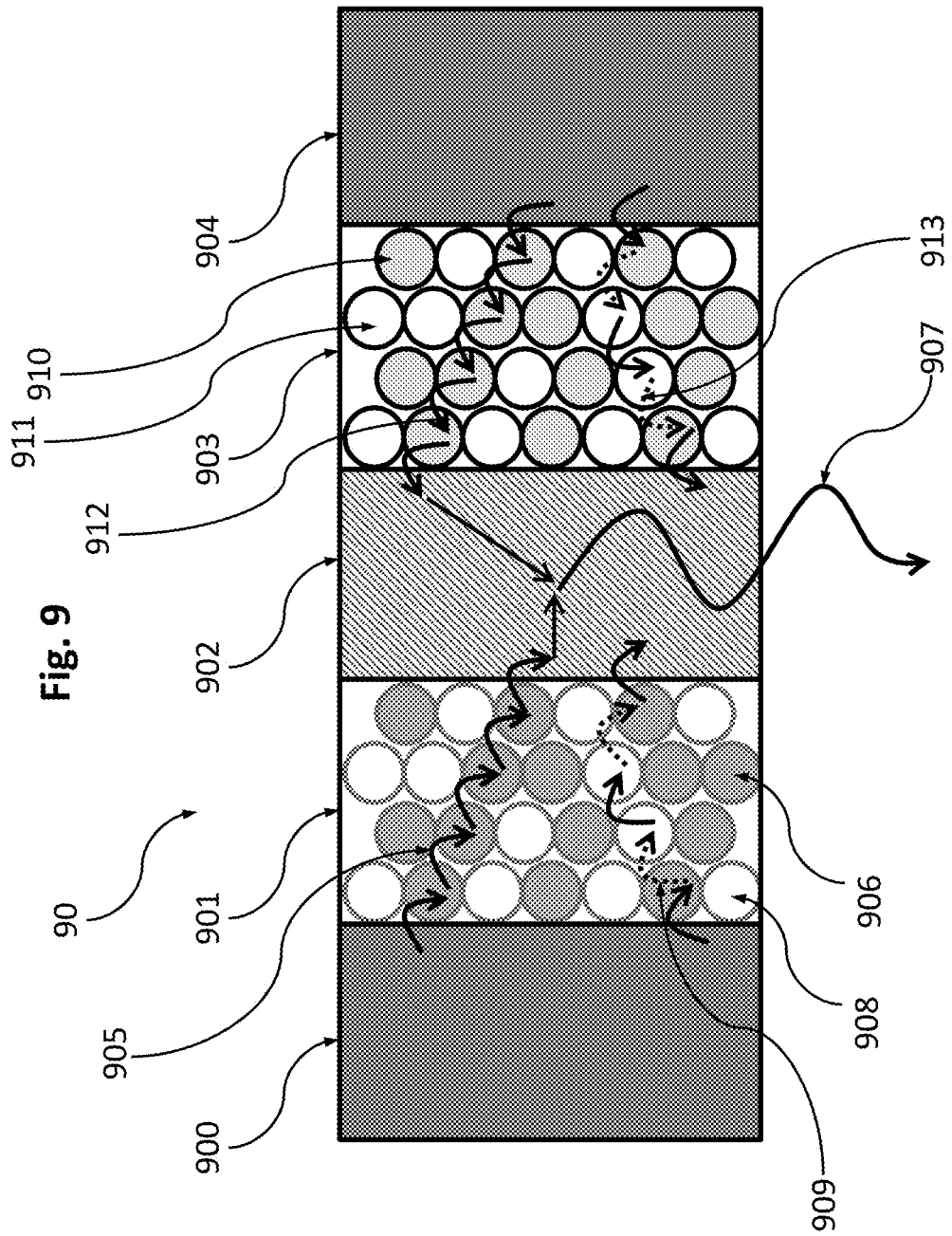
FIG. 9 is a drawing depicting an exemplary light-emitting device in accordance with embodiments of the present invention, having different populations of nanoparticles located within both an ETL and an HTL.

FIG. 9 is a drawing depicting an exemplary light-emitting device 90 in accordance with embodiments of the present invention, having different populations of nanoparticles located within both an ETL and an HTL. The light-emitting device 90 includes an anode 904 and a cathode 900, and a light-emitting layer 902 containing a material that emits light 907. Within the light-emitting layer 902, light is produced upon electron and hole recombination to generate the light 907. The light-emitting layer 902 may be an inorganic or organic semiconductor layer, or a layer of quantum dots (QDs). At least one hole transport layer (HTL) 903 is provided between the anode 904 and the emissive layer 902, which provides transport of holes from the anode and injection of holes into the emissive layer. Similarly, at least one electron transport layer (ETL) 901 is between the cathode 900 and emissive layer 902, which provides transport of electrons from the cathode and injection of electrons into the emissive layer.

In the embodiment of FIG. 9, the ETL 901 includes a first nanoparticle population 906 and a second nanoparticle population 908, wherein the first nanoparticle population 906 and second nanoparticle population 908 are conductive nanoparticles that are energetically non-aligned. Although the example of FIG. 9 looks comparable to FIG. 3 in using different shading (which in FIG. 3 denotes different materials), any suitable property may be employed for rendering the different nanoparticle populations energetically non-aligned, including different materials, different nanoparticle sizes, and/or different nanoparticle shapes. Because of such mixture of energetically non-aligned nanoparticles, again there consequently are different categories of intersite transport between two adjacent nanoparticles. In a first category of ETL intersite transport 905 (as represented by solid arrows in FIG. 9), intersite transport occurs between two energetically aligned nanoparticles. The intersite transport 905 thus corresponds to the top portion of FIG. 4, by which the barrier energy is relatively low. In a second category of ETL intersite transport 909 (as represented by dotted arrows in FIG. 9), intersite transport occurs between two energetically non-aligned nanoparticles. The intersite transport 909 thus corresponds to the bottom portion of FIG. 4, by which the barrier energy is relatively high. Electrons hop to energetically aligned nanoparticles, as shown by transport 905, at a much higher rate than hopping to energetically non-aligned nanoparticles, as shown by transport 909.

Different nanoparticle populations may be more suitable for electronic transport as compared to hole transport, and vice versa. Accordingly, in exemplary embodiments the ETL and the HTL layer include respective different mixtures of a first nanoparticle population and a second nanoparticle population. In other words, a first nanoparticle population of the ETL mixture differs from a first nanoparticle population of the HTL mixture, and a second nanoparticle population of the ETL mixture differs from a second nanoparticle population of the HTL mixture. Within each of the different ETL and HTL mixtures, the second nanoparticle population is different from the first nanoparticle population.

In addition, in the embodiment of FIG. 9, the HTL 903 includes a first nanoparticle population 910 and a second nanoparticle population 911, wherein the first nanoparticle population 910 and second nanoparticle population 911 are conductive nanoparticles that are energetically non-aligned. Again, although the example of FIG. 9 is comparable to FIG. 3 in using different shading (which in FIG. 3 denotes different materials), any suitable property may be employed for rendering the different nanoparticle populations energetically non-aligned, including different materials, different nanoparticle sizes, and/or different nanoparticle shapes. Because of such mixture of energetically non-aligned nanoparticles, again there consequently are different categories of intersite transport between two adjacent nanoparticles. In a first category of HTL intersite transport 912 (as represented by solid arrows in FIG. 9), intersite transport occurs between two energetically aligned nanoparticles. The intersite transport 912 thus corresponds to the top portion of FIG. 4, by which the barrier energy is relatively low. In a second category of HTL intersite transport 913 (as represented by dotted arrows in FIG. 9), intersite transport occurs between two energetically non-aligned nanoparticles. The intersite transport 913 thus corresponds to the bottom portion of FIG. 4, by which the barrier energy is relatively high. Holes hop to energetically aligned nanoparticles, as shown by transport 912, at a much higher rate than hopping to energetically non-aligned nanoparticles, as shown by transport 913. Such configuration achieves an energy difference in the conduction band edge of the ETL of at least 0.2 eV, and an energy difference in the valence band edge of the HTL of at least 0.2 eV, and generally between 0.2 eV and 4 eV at room temperature.

In the various exemplary embodiments, particular choices of materials for each layer may be made as is suitable for any particular application or configuration. For example the following materials may be employed for the various layers, in which either or both of the HTL and ETL are comprised of a mixture of different nanoparticles. The anode and cathode may be either a highly conductive metal (such as but not limited to Al, Au, Ag, Mg:Ag alloy, or a Ca/Al bilayer) or a metal oxide (such as but not limited to Indium Tin Oxide (ITO), Fluorinated Tin Oxide (FTO), Tin Oxide ($SnO_2$), Indium Oxide ($In_2O_3$), indium zinc oxide (IZO), or Zinc Oxide (ZnO)). The HTL is an organic or inorganic homogeneous material or combination of homogenous materials, such as but not limited to poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N, N'-bis(4-butylphenyl)-N, N'-bisphenylbenzidine) (PolyTPD), 2,3,5,6-tetrafluoro-7,7,8,8-tetracyanoquinodimethane (F4TCNQ), 1,4,5,8,9,11-hexaazatriphenylenehexacarbonitrile (HATCN). The HTL can alternatively be a mixture of different nanoparticles such as $V_2O_5$, $MoO_3$, NiO, CuO, $WO_3$. The ETL may include materials such as but not limited to 2,2',2"-(1,3,5-benzinetriyl)-tris(1-phenyl-1-H-benzimidazole) (TPBi), 8-quinolinato lithium (Liq.), LiF, $Cs_2CO_3$. The ETL can alternatively be a mixture of different nanoparticles such as $Mg_xZn_{1-x}O$, $Al_xZn_{1-x}O$, $TiO_2$, $ZrO_2$, $Al_2O_3$, HfO, $CeO_2$, $Fe_2O_3$, $SnO_2$, $In_2O_3$ where $0 \leq x \leq 1$. The EML may be an emissive organic semiconductor such as Alq3, or a layer of emissive inorganic nanoparticles such as InP, CdSe, CdS, $CdSe_xS_{1-x}$, CdTe, $Cd_xZn_{1-x}Se$, $Cd_xZn_{1-x}Se_yS_{1-y}$, ZnSe, perovskites of the form $ABX_3$, $Zn_wCu_zIn_{1-(w+z)}S$, carbon, where $0 \leq w$, x, y, $z \leq 1$ and $(w+z) \leq 1$.

In exemplary embodiments, at least one of the ETL or HTL is comprised of a mixture of two or more types of nanoparticles, with the nanoparticles chosen to have an energy difference in their conduction band or valence band edge of at least 0.2 eV and up to approximately 4 eV. The lower end of the range, i.e., approximately 0.2 eV, is preferred, as such level tends to achieve the most efficient transfer rate and tends to be associated with more commonly used materials. The precise energy difference may vary with temperature, but the general principle remains applicable that charge mobility may be optimized in one or more charge transport layers by using different nanoparticle populations that are energetically non-aligned.

Such devices are commonly fabricated by solution process methods, such as but not limited to inkjet, gravure, slot-die coating, offset or transfer printing or by spin coating or doctor blading. Solution process methods allow subsequent layers (e.g. the ETL and EML) to be printed in sequence from solutions, with a drying step in between each printing step. Using a solution process method allows facile mixing of different nanoparticle distributions into a single ink to achieve the target mixture prior to application. One simply adds the correct fractions of the (and at least two), different nanoparticle distributions, each held separately in solution, but with the same solvent. These are then mechanically mixed, e.g. by shaking or sonicating to ensure uniformity, and applied as the mixed ETL layer.

An aspect of the invention is a light-emitting device that is optimized for radiative recombination and minimizes non-radiative recombination. In exemplary embodiments, the light-emitting device includes an emissive layer; a first electrode and a second electrode from which charges are generated; a first charge transport layer that injects charges from the first electrode into the emissive layer; and a second charge transport layer that injects charges from the second electrode into the emissive layer; wherein at least one of the charge transport layers includes a mixture of a first nanoparticle population and a second nanoparticle population, and the first nanoparticle population and the second nanoparticle population are conductive nanoparticles that are energetically non-aligned as between the first nanoparticle population and the second nanoparticle population. The light-emitting device may include one or more of the following features, either individually or in combination.

In an exemplary embodiment of the light-emitting device, nanoparticles of the first nanoparticle population and the second nanoparticle population are energetically non-aligned with each other by being made of different materials.

In an exemplary embodiment of the light-emitting device, the first nanoparticle population and the second nanoparticle population are different metal oxide nanoparticle populations.

In an exemplary embodiment of the light-emitting device, the first nanoparticle population includes nanoparticles of titanium oxide ($TiO_2$) and the second nanoparticle population includes nanoparticles of zinc oxide (ZnO).

In an exemplary embodiment of the light-emitting device, nanoparticles of the first nanoparticle population and the second nanoparticle population are energetically non-aligned with each other by having nanoparticles of different sizes.

In an exemplary embodiment of the light-emitting device, nanoparticles of the first nanoparticle population and the second nanoparticle population are energetically non-aligned with each other by having nanoparticles of different shapes.

In an exemplary embodiment of the light-emitting device, bandgaps of the first nanoparticle population and the second nanoparticle population are different by an amount of 0.2 eV to 4 eV at room temperature.

In an exemplary embodiment of the light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein the electron transport layer includes the mixture of the first nanoparticle population and the second nanoparticle population.

In an exemplary embodiment of the light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein the hole transport layer includes the mixture of the first nanoparticle population and the second nanoparticle population.

In an exemplary embodiment of the light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; the electron transport layer and the hole transport layer include respective different mixtures of a first nanoparticle population and a second nanoparticle population, whereby a first nanoparticle population of the electron transport layer mixture differs from a first nanoparticle population of the hole transport layer mixture, and a second nanoparticle population of the electron transport layer mixture differs from a second nanoparticle population of the hole transport layer mixture; and within each mixture, the second nanoparticle population is different from the first nanoparticle population.

In an exemplary embodiment of the light-emitting device, nanoparticles of the first nanoparticle population and the second nanoparticle population are non-emissive within a wavelength range of light emission from the emissive layer.

In an exemplary embodiment of the light-emitting device, the emissive layer includes quantum dots for light emission.

In an exemplary embodiment of the light-emitting device, an energy barrier for charge transport between energetically non-aligned nanoparticles of different nanoparticle populations is at least eight times the thermal energy at operating temperature.

Another aspect of the invention is a method of manufacturing a light-emitting device in a manner that optimizes radiative recombination and minimizes non-radiative recombination. In exemplary embodiments, the method includes the steps of forming a light emitting device comprising: an emissive layer; a first electrode and a second electrode from which charges are generated; a first charge transport layer that injects charges from the first electrode into the emissive layer; and a second charge transport layer that injects charges from the second electrode into the emissive layer; and incorporating into at least one of the charge transport layers a mixture of a first nanoparticle population and a second nanoparticle population, and the first nanoparticle population and the second nanoparticle population are conductive nanoparticles that are energetically non-aligned with each other; wherein a proportion of the first nanoparticle population relative to the second nanoparticle population is selected such that a mobility of charges in the first charge transport layer is tuned to a mobility of charges in the second transport layer. The method may include one or more of the following features, either individually or in combination.

In an exemplary embodiment of the method of manufacturing a light-emitting device, the proportion of the first nanoparticle population relative to the second nanoparticle population is selected such that the mobility of charges in the first charge transport layer is equal to or an integer multiple of the mobility of charges in the second transport layer.

In an exemplary embodiment of the method of manufacturing a light-emitting device, bandgaps of the first nanoparticle population and the second nanoparticle population are different by an amount of 0.2 eV to 4 eV at room temperature.

In an exemplary embodiment of the method of manufacturing a light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein the electron transport layer includes the mixture of the first nanoparticle population and the second nanoparticle population.

In an exemplary embodiment of the method of manufacturing a light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein the hole transport layer includes the mixture of the first nanoparticle population and the second nanoparticle population.

In an exemplary embodiment of the method of manufacturing a light-emitting device, the first electrode is a cathode and the second electrode is an anode; the first charge transport layer is an electron transport layer that injects electrons from the cathode into the emissive layer; and the second charge transport layer is a hole transport layer that injects holes from the anode into the emissive layer; wherein both the electron transport layer and the hole transport layer include respective mixtures of the first nanoparticle population and the second nanoparticle population.

In an exemplary embodiment of the method of manufacturing a light-emitting device, the emissive layer includes quantum dots for light emission.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to light-emitting devices that, for example, may be used for light-emitting elements in a display device, and QLED type display technology as a suitable example. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high resolution display is desirable.

REFERENCE SIGNS LIST

30—light-emitting device
60—light-emitting device

70—light-emitting device
80—light-emitting device
90—light-emitting device
100—cathode
101—electronic transport layer
102—light-emitting layer
103—hole transport layer
104—anode
105—charge hopping
106—nanoparticles
107—light
201—electron injection
202—hole injection
203—recombination
204—light
300—cathode
301—electron transport layer (ETL)
302—light-emitting layer
303—hole transport layer (HTL)
304—anode
305—first category of intersite transport
306—first nanoparticle population
307—light
308—second nanoparticle population
309—second category of intersite transport
401—energy level $\psi_1$
402—energy level $\psi_2$
403—energy barrier
404—intersite transport
405—energy level $\psi_1$
406—energy level $\psi_2$
407—energy barrier
408—intersite transport
501—resistance plot
502—refractive index plot
600—cathode
601—electron transport layer (ETL)
602—light-emitting layer
603—hole transport layer (HTL)
604—anode
605—first category of intersite transport
606—first nanoparticle population
607—light
608—second nanoparticle population
609—second category of intersite transport
700—cathode
701—electron transport layer (ETL)
702—light-emitting layer
703—hole transport layer (HTL)
704—anode
705—first category of intersite transport
706—first nanoparticle population
707—light
708—second nanoparticle population
709—second category of intersite transport
800—cathode
801—electron transport layer (ETL)
802—light-emitting layer
803—hole transport layer (HTL)
804—anode
805—first category of intersite transport
806—first nanoparticle population
807—light
808—second nanoparticle population
809—second category of intersite transport
900—cathode
901—electron transport layer (ETL)
902—light-emitting layer
903—hole transport layer (HTL)
904—anode
905—first category of intersite transport
906—first nanoparticle population
907—light
908—second nanoparticle population
909—second category of intersite transport
910—different first nanoparticle population
911—different second nanoparticle population
912—different first category of HTL intersite transport
913—different second category of HTL intersite transport
1001—first average conduction band minimum energy
1002—first energetic width for the population
1003—second average conduction band minimum energy
1004—second energetic width for the population
1005—separation

The invention claimed is:

1. A light-emitting device comprising:
an emissive layer;
a first electrode and a second electrode from which charges are generated;
a first charge transport layer that injects charges of a first type from the first electrode into the emissive layer; and
a second charge transport layer that injects charges of a second type different from the first type from the second electrode into the emissive layer;
wherein at least one of the first charge transport layers and the second charge transport layer includes a mixture of a first nanoparticle population and a second nanoparticle population in the first charge transport layer or the second charge transport layer, wherein the first nanoparticle population includes nanoparticles that is different from nanoparticles of the second nanoparticle population, and the first nanoparticle population and the second nanoparticle population are conductive nonemissive inorganic nanoparticles configured to transport a same type of charge of either the first type or the second type, and that are energetically non-aligned as between the first nanoparticle population and the second nanoparticle population; and
wherein energetically non-aligned comprises a difference in valence band energy between nanoparticles each configured to transport holes and a difference in conduction band energy between nanoparticles each configured to transport electrons.

2. The light-emitting device of claim 1, wherein nanoparticles of the first nanoparticle population and the second nanoparticle population are energetically non-aligned with each other by being made of different materials.

3. The light-emitting device of claim 2, wherein the first nanoparticle population and the second nanoparticle population are different metal oxide nanoparticle populations.

4. The light-emitting device of claim 3, wherein the first nanoparticle population includes nanoparticles of titanium oxide ($TiO_2$) and the second nanoparticle population includes nanoparticles of zinc oxide (ZnO).

5. The light-emitting device of claim 1, wherein nanoparticles of the first nanoparticle population and the second nanoparticle population are energetically non-aligned with each other by having nanoparticles of different sizes.

6. The light-emitting device of claim 1, wherein nanoparticles of the first nanoparticle population and the second nanoparticle population are energetically non-aligned with each other by having nanoparticles of different shapes.

7. The light-emitting device of claim 1, wherein bandgaps of the first nanoparticle population and the second nanoparticle population are different by an amount of 0.2 eV to 4 eV at room temperature.

8. The light-emitting device of claim 1, wherein:
the first electrode is a cathode and the second electrode is an anode;
the first charge transport layer is an electron transport layer that injects electrons from the cathode into the emissive layer; and
the second charge transport layer is a hole transport layer that injects holes from the anode into the emissive layer;
wherein the electron transport layer includes the mixture of the first nanoparticle population and the second nanoparticle population.

9. The light-emitting device of claim 1, wherein:
the first electrode is a cathode and the second electrode is an anode;
the first charge transport layer is an electron transport layer that injects electrons from the cathode into the emissive layer; and
the second charge transport layer is a hole transport layer that injects holes from the anode into the emissive layer;
wherein the hole transport layer includes the mixture of the first nanoparticle population and the second nanoparticle population.

10. The light-emitting device of claim 1, wherein:
the first electrode is a cathode and the second electrode is an anode;
the first charge transport layer is an electron transport layer that injects electrons from the cathode into the emissive layer; and
the second charge transport layer is a hole transport layer that injects holes from the anode into the emissive layer;
the electron transport layer and the hole transport layer include respective different mixtures of a first nanoparticle population and a second nanoparticle population, whereby a first nanoparticle population of the electron transport layer mixture differs from a first nanoparticle population of the hole transport layer mixture, and a second nanoparticle population of the electron transport layer mixture differs from a second nanoparticle population of the hole transport layer mixture; and
within each mixture, the second nanoparticle population is different from the first nanoparticle population.

11. The light emitting device of claim 1, wherein nanoparticles of the first nanoparticle population and the second nanoparticle population are non-emissive within a wavelength range of light emission from the emissive layer.

12. The light-emitting device of claim 1, wherein the emissive layer includes quantum dots for light emission.

13. The light-emitting device of claim 1, wherein an energy barrier for charge transport between energetically non-aligned nanoparticles of different nanoparticle populations is at least eight times a thermal energy at operating temperature.

* * * * *